(12) United States Patent
Kadota

(10) Patent No.: US 6,448,585 B1
(45) Date of Patent: *Sep. 10, 2002

(54) SEMICONDUCTOR LUMINESCENT ELEMENT AND METHOD OF MANUFACTURING THE SAME

(75) Inventor: Michio Kadota, Kyoto (JP)

(73) Assignee: Murata Manufacturing Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/499,840

(22) Filed: Feb. 7, 2000

(30) Foreign Application Priority Data

Feb. 19, 1999 (JP) .......................... 11-041888

(51) Int. Cl.⁷ .............................. H01L 33/00
(52) U.S. Cl. .................... 257/103; 257/94; 257/96; 257/97
(58) Field of Search ................. 257/79, 101, 102, 257/103; 313/492, 498–499; 310/313 A, 312 A

(56) References Cited

U.S. PATENT DOCUMENTS

| 5,097,298 | A | | 3/1992 | Ehara |
| 5,432,397 | A | * | 7/1995 | Koike et al. ............. 310/358 |
| 5,846,844 | A | | 12/1998 | Akasaki et al. |
| 6,057,561 | A | * | 5/2000 | Kawasaki et al. ......... 257/94 |
| 6,146,765 | A | * | 11/2000 | Mitsui et al. ........... 428/428 |

FOREIGN PATENT DOCUMENTS

| EP | 0863555 | 9/1998 |
| JP | 07-262801 | 10/1995 |
| JP | 63-92067 | 4/1998 |
| JP | 10-270749 | 10/1998 |

* cited by examiner

Primary Examiner—Nathan J. Flynn
Assistant Examiner—Thomas L Dickey
(74) Attorney, Agent, or Firm—Ostrolenk, Faber, Gerb & Soffen, LLP

(57) ABSTRACT

A semiconductor luminescent element includes: a base substrate; a ZnO luminescent layer formed on the base substrate; and a ZnO buffer layer doped with an impurity and formed between the base substrate and the ZnO luminescent layer.

9 Claims, 3 Drawing Sheets

SEMICONDUCTOR LUMINESCENT ELEMENT AND METHOD OF MANUFACTURING THE SAME

BACKGROUND OF THE INVENTION

1. Field of the Invention

The present invention relates to a semiconductor luminescent element capable of emitting light by virtue of an exciton and, in particular, relates to a semiconductor luminescent element which is formed by using an epitaxial ZnO film and which has wave lengths in a range from blue light to ultraviolet light, and to a method of manufacturing the same.

2. Description of the Related Art

In recent years, there have been a demand for developing a multi-color luminescent display and a demand for improving a data density with respect to data communication and data recording. Therefore, there is a strong need to produce a semiconductor luminescent element having wave lengths in a range from blue light to ultraviolet light. As a material for forming a semiconductor luminescent element capable of emitting blue light, people have been interested in a semiconductor material based on the GaN system. But, since there are many technical problems in the process for manufacture such a semiconductor material, this material has not been put into practical use. Accordingly, the inventors have suggested using ZnO which can serve as a semiconductor material having wave lengths in a range from blue light to ultraviolet light, thereby making it possible to substitute such a material for a GaN system material. More specifically, to use ZnO, a ZnO film is allowed to grow epitaxially on a substrate plate. With the use of such epitaxial film, it has been tried to obtain a luminescent element which is capable of effecting a light emission by virtue of an exciton in the vicinity of a wave length of 370 nm.

However, there have been the following problems with the above semiconductor luminescent element formed by using the above ZnO film. Namely, the ZnO film to be used as a luminescent layer (hereinafter referred to as a ZnO luminescent layer) has to have an extremely excellent crystallinity. But, the formation of such ZnO luminescent layer is extremely difficult. Conventionally, ZnO film is used in various electronic devices. If it is a polycrystal ZnO film having only a relatively low crystallinity, it can be easily manufactured in a large amount with the use of a sputtering method. Further, if a sapphire substrate is used as a substrate plate, a film formation method may be employed to form ZnO epitaxial film by virtue of the sputtering treatment. However, the epitaxial ZnO film formed with the use of the above method does not have a satisfactory orientation, hence making it impossible to provide a good crystallinity which is required in forming a luminescent element. For this reason, in order to form a ZnO luminescent layer which can be used as a luminescent element, it is necessary to use a sapphire substrate as a substrate plate, and to use an expensive and delicate film formation method such as a Laser MBE (Molecular Beam Epitaxy) method. However, such a film formation method is extremely limited in its use. Further, even using the above discussed method one is still not sure of being able to reproducibly obtain a ZnO luminescent film having a fully satisfactory film quality. In addition, with the Laser MBE method, an obtainable area of the ZnO luminescent layer is extremely small, i.e., at most several square millimeters. Moreover, a speed for the formation of the film is slow, making the method not suitable for an industrial mass production.

SUMMARY OF THE INVENTION

Therefore, it is an object of the present invention to provide a semiconductor luminescent element having a ZnO luminescent layer exhibiting a satisfactory crystallinity as a luminescent element.

Another object is to provide a method capable of reproducibly manufacturing such element on a mass production scale.

The foregoing and other objects are achieved in accordance with certain aspects of the invention by a semiconductor luminescent element which comprises: a base substrate; a ZnO luminescent layer formed on the base substrate; and a ZnO buffer layer doped with an impurity and formed between the base substrate and the ZnO luminescent layer.

The base substrate is preferably made of a material selected from the group consisting of sapphire, quartz, silicon, glass and fused quartz. The impurity is preferably selected from the group consisting of Li, Cu, Ni, Y, Ag, Mn, Mg, Al, V, Fe, La, Ti, Ta, Nb and Ga.

According to the present invention, it is possible to manufacture, with the use of a relatively easy method, such as a sputtering method, and with a high productivity, a ZnO luminescent layer having a good orientation/crystallinity suitable for use as a luminescent element which was difficult to manufacture in the past.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

The semiconductor luminescent element of the present invention comprises a base substrate, such as a sapphire substrate, and a ZnO luminescent layer formed on the base substrate, characterized in that a ZnO buffer layer doped with an impurity is formed between the above base substrate and the ZnO luminescent layer. Here, as a substrate for use as a base substrate, it is satisfactory to use a sapphire substrate, a quartz substrate, a silicon substrate, a glass substrate or a fused quartz substrate. Further, an impurity to be doped into the ZnO buffer layer, is at least one kind of metal selected from a group consisting of Li, Cu, Ni, Y, Ag, Mn, Mg, Al, V, Fe, La, Ti, Ta, Nb and Ga.

The inventors have found that if a ZnO buffer layer doped with an impurity is interposed between the base substrate and the ZnO luminescent layer, it is possible to improve an orientation/crystallinity of the ZnO luminescent layer formed on the buffer layer, thereby accomplishing the present invention. This is because, by doping a predetermined impurity in the ZnO buffer layer, it is possible to improve the orientation and crystallinity of the ZnO buffer layer, thereby at the same time improving the crystallinity of the ZnO luminescent layer formed on the buffer layer.

In this way, since a buffer layer is formed which has a good orientation and a good crystallinity, a sputtering method which could not be used as a film formation method for forming the ZnO luminescent layer in the prior art in view of causing poor crystallinity, has now become possible to be used in manufacturing the ZnO luminescent layer of the semiconductor luminescent element in the present invention.

It is to be noted that the ZnO buffer layer and ZnO luminescent layer referred to in this specification may include ZnO and ZnMgO.

Hereinafter, the preferred embodiments of the present invention are explained in more detail with reference to the drawings.

Figure 1:
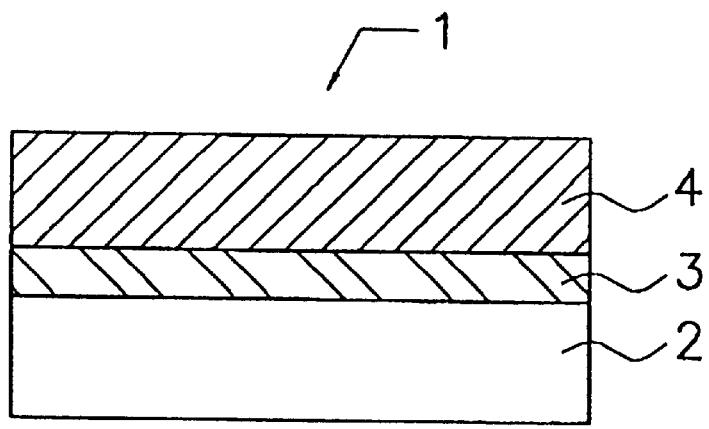
FIG. 1 is a cross sectional view indicating the structure of a semiconductor luminescent element made according to one embodiment of the present invention.

A semiconductor luminescent element 1 made according to a first embodiment of the present invention comprises, as shown in FIG. 1, a c-plane sapphire substrate 2, a buffer layer 3 containing Ni as an impurity, and a ZnO luminescent layer 4 formed on the ZnO buffer layer 3.

The semiconductor luminescent element 1 having the above structure is manufactured in the following process. At first, a c-plane sapphire substrate 2 is prepared for use as a base substrate. Then, the ZnO buffer layer 3 doped with Ni is formed on the sapphire substrate 2 using a sputtering method, thereby obtaining a film thickness of 1.3 $\mu$m. During the process of film formation, an Ar/O$_2$ gas is used, and a ZnO ceramic target or a Zn metal target containing Ni as an impurity may be used as a sputtering target, so as to obtain the above film. As a sputtering apparatus, an apparatus such as RF sputtering apparatus or ECR sputtering apparatus may be used. After the formation of the ZnO buffer layer 3, the same sputtering method is employed again to form the ZnO luminescent layer 4 having a thickness of 1.0 $\mu$m, with the use of the ZnO ceramic target or Zn metal target. Thus, the semiconductor luminescent element 1 may be manufactured using a sputtering process. However, each of the above ZnO films is an epitaxial film.

In the past, although it was possible to form a ZnO epitaxial film once the ZnO film was formed on the c-plane sapphire substrate with the use of a sputtering method, it was difficult to obtain a sufficient orientation/crystallinity. For this reason, such an epitaxial film as the ZnO luminescent layer was not used. Further, even if the epitaxial film were used as a buffer layer and a second ZnO epitaxial film were formed thereon, it was difficult for the second epitaxial film to obtain a sufficient crystallinity, hence rendering it impossible to use such film as the ZnO luminescent layer. However, when a Ni-doped ZnO buffer layer is formed with the use of a sputtering method, a ZnO epitaxial film may be obtained, which has an excellent orientation/crystallinity. Nevertheless, since the ZnO buffer layer itself is doped with an impurity, it is not suitable for use as the ZnO luminescent layer. On the other hand, if the ZnO epitaxial film is formed on the ZnO buffer layer having an excellent orientation/crystallinity, it is possible to form the ZnO luminescent layer which can be used to form a luminescent layer.

It is preferred that the ZnO buffer layer be formed so as to have a thickness of 0.3 $\mu$m or more. When the buffer layer has a thickness which is less than 0.3 $\mu$m, even if an impurity is added, it is still difficult to form a buffer layer having a sufficient orientation/crystallinity. Here, sufficient orientation/crystallinity means that a rocking curve half value width obtained by X-ray diffraction of the ZnO buffer layer is 2 degree or less. The reason for the above is that by selecting the above values, it is possible to obtain a ZnO luminescent layer which is relatively stable and therefore may be used to form the luminescent element. Further, it is preferred that the ZnO luminescent layer be formed as having a thickness of 0.05 $\mu$m or more. The reason for this is that, even if the crystallinity of the ZnO buffer layer is good, when the ZnO luminescent layer is not formed as having a thickness of 0.05 $\mu$m or more, it will be difficult to obtain a ZnO luminescent layer having a good crystallinity sufficient for it to be used as a luminescent layer. The relationship between the thickness of the ZnO buffer layer and the thickness of the ZnO luminescent layer is as follows: the thinner the thickness of the ZnO buffer layer, the more necessary it is to form a ZnO luminescent layer having a large thickness, and the larger the thickness of the ZnO buffer layer, the thinner the ZnO luminescent layer may be made. For example, when the thickness of the buffer layer is as small as 0.3 $\mu$m, the ZnO luminescent layer is required to have a thickness of 0.1 $\mu$m or more. On the other hand, when the buffer layer has a thickness of about 1.0 $\mu$m, the ZnO luminescent layer need only have a thickness of about 0.05 $\mu$m or more.

In the present embodiment, although Ni is used as an impurity, other impurities can be added in the buffer layer, and it is preferred to use at least one of the following metallic elements including Li, Cu, Y, Ag, Mn, Mg, Al, V, Fe, La, Ti, Ta, Nb, Ga, to improve the orientation/crystallinity of the ZnO buffer layer. Further, although in the present embodiment a c-plane sapphire substrate is used as a base substrate, it has been understood that a Z-cut quartz substrate, an n-type silicon substrate, a glass substrate, or a fused quartz substrate may also be used as the base substrate, provided that the above impurity is doped in the ZnO buffer layer, thereby similarly forming the ZnO buffer layer having a good orientation/crystallinity. A heating temperature used in a process for forming the ZnO buffer layer and the ZnO luminescent layer is preferred to be 200 to 600° C. so as to ensure a good crystal orientation. A partial pressure ratio of $Ar/O_2$ during the film formation process is preferred to be in a range of 60/40 to 95/5 when using a ceramic target, but is preferred to be in a range of 40/60 to 90/10 when using a metal target.

Figure 2:
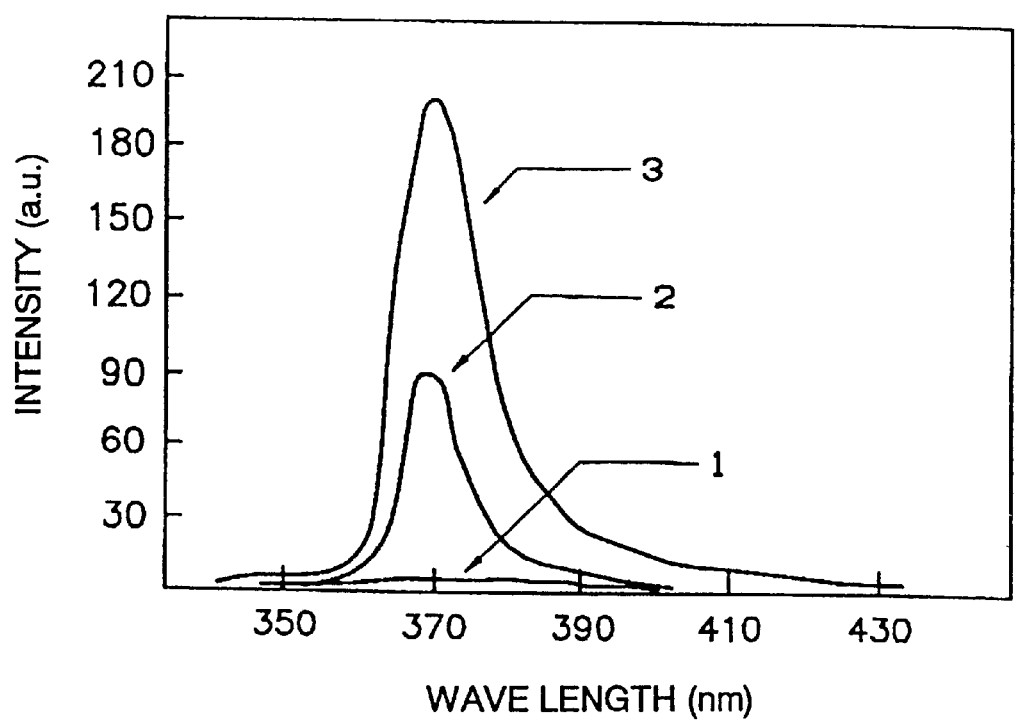
FIG. 2 is a graph showing a comparison between the photo luminescence measurement results obtained on the ZnO luminescent layer made according to the present invention and the photo luminescence measurement results obtained on a ZnO luminescent layer made according to a prior art process.

Here, in order to confirm the film quality of the ZnO luminescent layer of the present invention, an experiment was conducted to carry out a comparison between the above luminescent layer and a ZnO luminescent layer obtained by using a conventional manufacturing method. In more detail, an element obtained by directly forming a ZnO luminescent layer on a sapphire substrate through sputtering treatment without forming a ZnO buffer layer thereon was prepared as a sample 1 (prior art), an element obtained by directly forming a ZnO luminescent layer on a sapphire substrate through a Laser MBE method without forming the ZnO buffer layer thereon was prepared as a sample 2 (prior art), an element obtained by first forming a Ni-doped ZnO buffer layer on a sapphire substrate and then forming a ZnO luminescent layer thereon through sputtering treatment was prepared as a sample 3 (present invention). Subsequently, each of the above samples is irradiated with a He—Cd laser beam having a wave length of 325 $\mu$nm, followed by a photo luminescence measurement. The results of the measurement are shown in FIG. 2. As may be understood from FIG. 2, with the sample 1 obtained by directly forming a ZnO luminescent layer on the sapphire substrate through sputtering treatment, photo luminescence light emission was not found. However, with the element obtained by directly forming a ZnO luminescent layer through Laser MBE method, and with the element obtained by forming a ZnO luminescent layer on the Ni-doped ZnO buffer layer, photo luminescence light emission was found. Nevertheless, it is understood that the above sample 3 has a stronger luminescence intensity than that of the above sample 2.

Further, as to sample 2 and sample 3, they are different not only in their light emission intensities but also in their productivities. Namely, the above sample 2 is obtained by a Laser MBE method, hence it is impossible for a ZnO luminescent layer to be formed except for a quite small area of at most several square millimeters. On the other hand, the above sample 3 is obtained by virtue of sputtering treatment so that the ZnO buffer layer/luminescent layer are formed at the same time, thereby ensuring a desired film formation on the entire area of a base substrate having a diameter of 3 to 6 inches during only one operation, thus ensuring an extremely high productivity.

Figure 3:
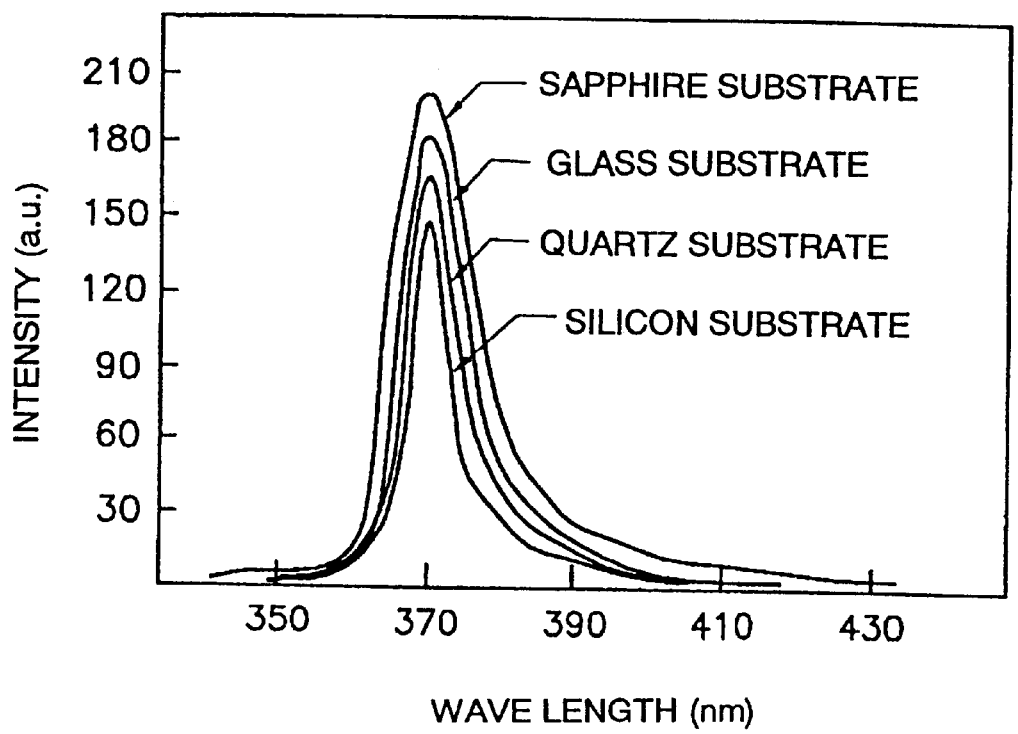
FIG. 3 is a graph indicating the photo luminescence measurement results obtained on the ZnO luminescent layer made according to the present invention, the measurement results being obtained with respect to different sorts of base substrates.

Next, the semiconductor luminescent element manufactured in the method of the present invention was subjected to an experiment which is conducted so as to investigate a variation in the film quality of the ZnO luminescent layer. Such a variation is caused only because the base substrate is changed. In more detail, samples were prepared which are formed by using c-plane sapphire substrate, a Z-cut quartz substrate, an n-type silicon substrate, and a glass substrate, all these substrates being used as base substrates. Then, a photo luminescent measurement was carried out in the same manner as the above using an He—Cd Laser beam. The results of the measurement are shown in FIG. 3. As may be understood from FIG. 3, with any of the samples formed by using the sapphire substrate, Z-cut quartz substrate, n-type silicon substrate and glass substrate, their photo luminescence light emitting intensities were found to be almost the same as one another. Further, as shown in this figure, when a fused quartz substrate is used as a base substrate, it is possible to obtain a light emitting property which is almost the same as in a condition where an n-type silicon substrate is used. Thus, it is understood from this fact that, if the element is formed by interposing a ZnO buffer layer doped with an impurity, it is possible to form a ZnO luminescent layer having a good crystallinity on a quartz substrate or a silicon substrate, which luminescent layer however was not possible to be obtained in the prior art.

However, in order to form a ZnO buffer layer and a ZnO luminescent layer each having a further improved orientation/crystallinity, it is preferred to use a high purity target having a purity of 99.99% or more, or to use a high purity introduction gas having a purity of 99.99% or more.

Figure 4:
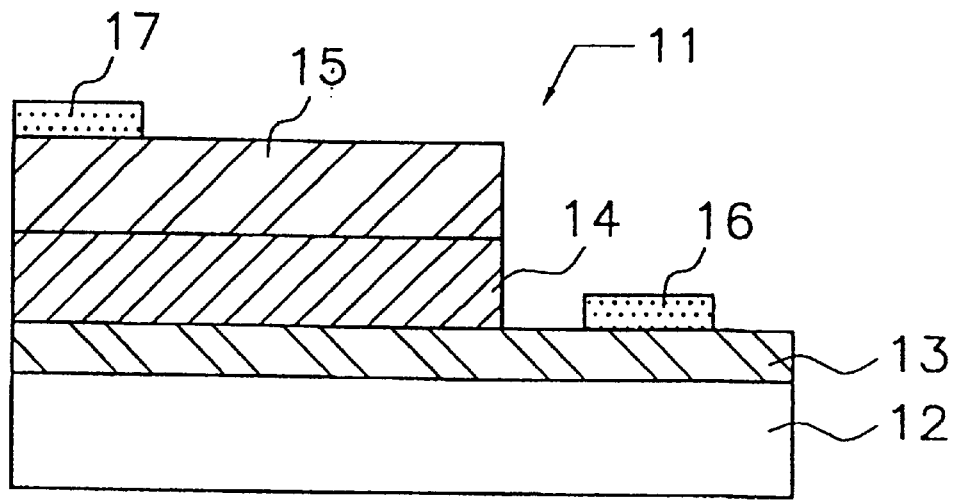
FIG. 4 is a cross sectional view indicating the structure of a semiconductor luminescent element made according to another embodiment of the present invention.

A semiconductor luminescent element 11 made according to the second embodiment of the present invention is a semiconductor luminescent element formed by using a ZnO luminescent layer, which is an LED having formed thereon electrodes for use in applying voltage from the outside of the element 11. In the following, description will be given to the structure of the luminescent element of this embodiment of the invention with reference to FIG. 4. At first, a ZnO buffer layer 13 doped with Al is formed on the c-plane sapphire substrate 12. Here, since Al has been doped into the buffer layer, the ZnO buffer layer 13 has become n-type ZnO. Then, a ZnO active layer 14 is formed on the ZnO buffer layer 13. Further, a p-type ZnO layer 15 doped with N (or its ions) is formed on the active layer. The ZnO layers 13, 14 and 15 are all epitaxial films each formed by virtue of a sputtering treatment.

The p-type ZnO layer 15 and the ZnO active layer 14 are partially removed through etching treatment. On the exposed areas of the ZnO buffer layer 13 obtained after the etching treatment, a lower electrode 16 in ohmic contact with ZnO is formed. The lower electrode 16 being made of a metal material such as Ti/Au. On the p-type ZnO layer 15 is similarly formed an upper electrode 17 consisting of a metal in ohmic contact with ZnO.

In a p-n combined type semiconductor luminescent element 11 having the above structure, if an electric voltage is applied to a position between the lower electrode 16 and the upper electrode 17, it is possible to effect an exciton light emission so as to emit light in a range from blue light to ultraviolet light.

Figure 5:
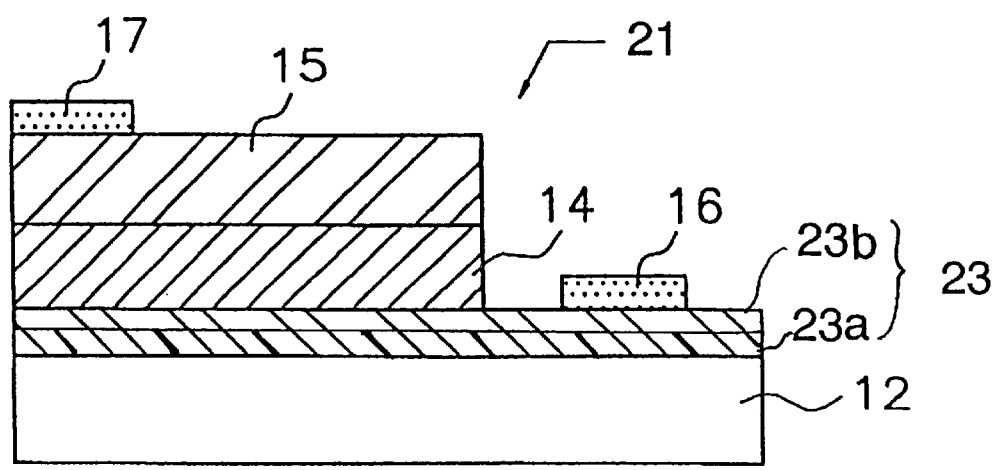
FIG. 5 is a cross sectional view indicating the structure of a semiconductor luminescent element made according to a variation of the embodiment shown in FIG. 4.

In a variant of the above structure of the second embodiment, the ZnO buffer layer 13 may be formed as a two-layer structure. As shown in FIG. 5, a semiconductor luminescent element 21 includes a ZnO buffer layer 23 between the c-plane sapphire substrate 12 and the ZnO active layer 14. The ZnO buffer layer 23 has a first sub-layer 23a formed on the c-plane sapphire substrate 12 and a second sub-layer 23b in contact with the ZnO active layer 14. It is preferable that the first sub-layer 23a is made of ZnO doped with a dopant which is excellent in improving an orientation or crystallinity of ZnO. Such a dopant includes Li, Cu, Ni, Y, Ag, Mn, Mg, Fe, La, Ti, Ta, Na and Ga, and Ni is more preferable for the dopant. On the contrary, it is preferable that the second sub-layer 23b is made of ZnO doped with a dopant capable of reducing a resistance of the ZnO. Such a dopant includes Al and V.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A semiconductor luminescent element comprising:

a base substrate;

a ZnO luminescent layer formed on the base substrate; and a ZnO buffer layer doped with an impurity and formed between the base substrate and the ZnO luminescent layer, the impurity being selected from the group consisting of Li, Cu, Ni, Y, Ag, Mn, Al, V, Fe, La, Ti, Ta, Nb and Ga and the ZnO buffer layer having a thickness of 0.3 $\mu$m or more.

2. A semiconductor luminescent element according to claim 1, wherein the base substrate is made of a material selected from the group consisting of sapphire, quartz, silicon, glass and fused quartz.

3. A semiconductor luminescent element comprising:

a base substrate;

a ZnO luminescent layer formed on the base substrate;

a first ZnO layer having a thickness of 0.3 $\mu$m or more doped with an impurity of a first conductivity type and formed between the base substrate and the ZnO luminescent layer, the impurity being selected from the group consisting of Li, Cu, Ni, Y, Ag, Mn, Al, V, Fe, La, Ti, Ta, Nb and Ga; and a second ZnO layer doped with an impurity of a second conductivity type and formed on the ZnO luminescent layer.

4. A semiconductor luminescent element according to claim 3, wherein the ba se substrate is made of a material selected from the group consisting of sapphire, quartz, silicon, glass and fused quartz.

5. A semiconductor luminescent element according to claim 3, wherein the first conductivity type is n-type and the second conductivity type is p-type.

6. A semiconductor luminescent element according to claim 3, wherein the first ZnO layer includes a first sub-layer formed on the base substrate and a second sub-layer in contact with the ZnO luminescent layer, and the second sub-layer is doped with the impurity of the first conductivity type.

7. A semiconductor luminescent element according to claim 6, wherein the impurity of the first conductivity type is selected from one of Al and V.

8. A semiconductor luminescent element according to claim 6, wherein the first sub-layer is doped with Ni.

9. A semiconductor luminescent element comprising:

a base substrate made of a material selected from the group consisting of sapphire, quartz, silicon, glass and fused quartz;

a ZnO luminescent layer which emits light in a range from blue to ultraviolet; and a ZnO buffer layer having a thickness of 0.3 $\mu$m or more provided between the base substrate and the ZnO luminescent layer and including a first sub-layer and a second sub-layer, the first sublayer being formed on the base substrate and doped with an impurity selected from the group consisting of Li, Cu, Ni, Y, Ag, Mn, Fe, La, Ti, Ta, Nb and Ga, the second sub-layer being in contact with the ZnO luminescent layer and doped with an impurity selected from one of Al and V.

\* \* \* \* \*